United States Patent [19]

Ibe

[11] Patent Number: 5,176,490
[45] Date of Patent: Jan. 5, 1993

[54] MONOCRYSTAL ROD CONVEYING APPARATUS

[75] Inventor: Hiroyuki Ibe, Nyu, Japan

[73] Assignee: Shin-Etsu Handotai Company, Limited, Japan

[21] Appl. No.: 705,436

[22] Filed: May 24, 1991

[30] Foreign Application Priority Data

May 28, 1990 [JP] Japan .................. 2-138902

[51] Int. Cl.⁵ .............................. C30B 15/00
[52] U.S. Cl. .................... 414/626; 422/249; 414/591; 901/17; 901/21; 901/39
[58] Field of Search ............. 414/560, 561, 626, 591, 414/736, 225; 901/17, 21, 23, 38, 39; 422/249; 156/601, 617.1, DIG. 97; 198/346.3

[56] References Cited

U.S. PATENT DOCUMENTS

| | | | |
|---|---|---|---|
| 3,280,991 | 10/1966 | Melton et al. | 901/23 X |
| 3,951,271 | 4/1976 | Mette | 901/17 X |
| 4,005,782 | 2/1977 | Crockett | 414/591 |
| 4,132,318 | 1/1979 | Wang et al. | 414/591 |
| 4,350,560 | 9/1982 | Helgeland et al. | 422/249 X |
| 4,410,494 | 10/1983 | Fiegl | 156/601 X |
| 4,523,972 | 6/1985 | Cushman et al. | 422/249 X |
| 4,904,153 | 2/1990 | Iwasawa et al. | 901/17 X |
| 5,028,195 | 7/1991 | Ishii et al. | 901/17 X |

FOREIGN PATENT DOCUMENTS

| | | | |
|---|---|---|---|
| 47-42513 | 12/1972 | Japan . | |
| 60-41038 | 9/1985 | Japan . | |
| 1491698 | 7/1989 | U.S.S.R. | 901/21 |
| 1495125 | 7/1989 | U.S.S.R. | 901/21 |
| 2116871 | 10/1983 | United Kingdom . | |
| 2155899 | 10/1985 | United Kingdom | 901/39 |

OTHER PUBLICATIONS

Helgeland, W. et al., "Apparatus for and Method of Handling Crystals From Crystal-Growing Furnaces", Int. Pub. No. WO82/04074, Int. Appl. No. PCT/US81/00668, 16 pp., 25 November 1982.
"Silicon Crystal Removal Tool", IBM Technical Disclosure Bulletin vol. 30, No. 10, Mar. 1988, pp. 102-103.

Primary Examiner—David A. Bucci
Attorney, Agent, or Firm—Browdy and Neimark

[57] ABSTRACT

The present invention relates to a device 32 for taking out a grown monocrystal rod 22 from monocrystal pulling up devices 10 to 14 and conveying them to a predetermined position. An object is to simplify the overall structure, which includes a plurality of monocrystal pulling up devices 10 to 14, and reducing the overall cost. A rail 31 is disposed along the monocrystal pulling up devices 10 to 14 and travelling portions 33 and 34 travel along the rail 31. The upper end portion of an upper cylinder 36 is fixed to the travelling portions 33 and 34, the upper portion of an elevational shaft 37 is inserted into the upper cylinder 36, the lower portion of the elevational shaft 37 is inserted into a lower cylinder 39 and a plate 44 is able to approach and move away from the lower cylinder 39. A plate 45 is able to rotate around a shaft 46 with respect to the position of the plate 44. Futhermore, the plate 45 has a receiving finger 53A and a holding finger 54A.

6 Claims, 8 Drawing Sheets

STEP 103

STEP 102

STEP 101

STEP 107

STEP 106

STEP 104 AND 105

STEP 112 AND 113

STEP 108

MONOCRYSTAL ROD CONVEYING APPARATUS

BACKGROUND OF THE INVENTION

The present invention relates to a monocrystal rod conveying apparatus for taking out a grown monocrystal rod from a monocrystal growing device and conveying it to a predetermined position.

DESCRIPTION OF RELATED ART

For example, a monocrystal pulling up device acting in accordance with the CZ method is arranged in such a manner that a monocrystal is grown in a main chamber under vacuum. When the crystal has been grown, the monocrystal rod is raised into a pull chamber disposed above the main chamber before a gate disposed at the junction between the main chamber and the pull chamber is closed while opening a shutting door disposed in the pull chamber. Then, the monocrystal rod is taken out.

Since the monocrystal rod thus-taken-out is heavy and hot, special devices for unloading the monocrystal rod from the pull chamber have been disclosed in Japanese Utility Model Publication No. 47-42513 and Japanese Patent Publication No. 60-41038.

However, since the above-disclosed conventional apparatus has been integrally formed with each of monocrystal pulling up devices, the overall structure of the facility has been too complicated and the overall cost could not be reduced.

Furthermore, since the pull chamber must be moved whenever the monocrystal rod is taken out from the pull chamber, the structure of the monocrystal pulling up device has been too complicated.

In addition, a conveying device must be provided to each monocrystal pulling up device for the purpose of conveying the monocrystal rod which has been unloaded from the pull chamber.

SUMMARY OF THE INVENTION

To this end, an object of the present invention is to provide a monocrystal rod conveying apparatus capable of simplifying the overall structure, which takes care of a plurality of monocrystal pulling devices, and reducing the overall cost.

According to one aspect of the present invention, there is provided a monocrystal rod conveying apparatus for unloading monocrystal rods grown in a plurality of monocrystal pulling devices disposed in series and conveying them, the monocrystal rod conveying apparatus comprising: guide means disposed along a plurality of the monocrystal pulling devices; a traveling portion for travelling along the guide means; a body portion, an end portion of which, is secured to the travelling portion; a hand portion for holding/releasing the monocrystal rod; a movable base portion for supporting the hand portion; and an expansion portion arranged in such a manner that its end portion is fastened to the body portion and another end portion is fastened to the movable base portion, the expansion portion being capable of changing the distance between the body portion and the movable base.

In the thus arranged structure, the expansion portion is expanded so that the hand portion is introduced into the pull chamber of the monocrystal pulling up device. Then, the hand portion is closed so that the monocrystal rod is held before the expansion portion is contracted. Then, the monocrystal rod is conveyed by means of the travelling portion along the guide means to a predetermined position.

According to the present invention, it is necessary to provide one monocrystal rod conveying apparatus for a plurality of monocrystal pulling up devices disposed in series. Furthermore, the monocrystal rod conveying apparatus is independently structured from the monocrystal pulling device. In addition, the necessity of providing a conveying device to each monocrystal pulling up device to convey the monocrystal rod unloaded from the monocrystal pulling device to a predetermined position can be eliminated. Therefore, the overall structure can be simplified and the overall cost can be reduced.

The above-described body portion includes: a base portion secured to the travelling portion; and a rotational portion capable of rotating around a vertical shaft with respect to the position of the base portion, the end portion of the expansion portion being fastened to the rotational portion.

According to the thus arranged structure, when the travelling portion travels, the expansion portion and the hand portion are caused to face the traveling direction. When the monocrystal rod is unloaded from the monocrystal pulling device, the expansion portion and the hand portion are rotated toward the monocrystal pulling device.

According to this structure, the width in a direction perpendicular to the travelling direction can be reduced at the time of travelling. Therefore, a sufficiently wide passage can be created and the safety of the operators can be improved.

The above-described movable base includes: a back base secured to the other end portion of the expansion portion; and a tilt base to which the hand portion is fastened, the tilt base being fastened in such a manner that it is capable of rotating around a horizontal shaft in the lower portion with respect to the position of the back base, the hand portion being provided for the tilt base.

In the thus arranged structure, the monocrystal rod is conveyed to a predetermined position before the tilt base is made to be horizontal and the hand portion is opened. As a result, the monocrystal rod is placed on, for example, a conveyer disposed adjacently.

According to this structure, the necessity of providing an individual unloader can be eliminated, causing the overall structure to be further simplified. In addition, the overall cost can be further reduced.

The above-described guide means is a rail disposed adjacently to the ceiling of a factory.

According to this structure, the space below the rail can be reduced.

The above-described body portion is arranged in such a manner that the rotational portion is able to move vertically with respect to the position of the base portion.

According to this structure, the space below the rail can be effectively utilized and the safety of the operators can be satisfactorily improved.

Other and further objects, features and advantages of the invention will appear more fully form the following description.

BRIEF DESCRIPTION OF THE DRAWINGS

FIGS. 1 to 6H illustrate an embodiment of a monocrystal rod conveying apparatus according to the present invention. where FIG. 1 is a perspective view which illustrates a state where a monocrystal rod conveying apparatus 32 is unloading a monocrystal rod 22 from a pull chamber 21;

FIG. 2 is a partial cross sectional view which illustrates the monocrystal rod conveying apparatus 32 in a conveying state;

FIG. 3 is a plan view which illustrates a finger drive portion 51B;

FIG. 4 is a perspective view which illustrates the overall structure of the monocrystal rod conveying apparatus 32 and the portion relating to it;

FIG. 5 is a flow chart which illustrates the sequence of conveying the monocrystal rod 22; and FIGS. 6A to 6H illustrate the operation which corresponds to FIG. 4.

DESCRIPTION OF THE PREFERRED EMBODIMENT

A preferred embodiment of the present invention will now be described with reference to the drawings.

Figure 1:
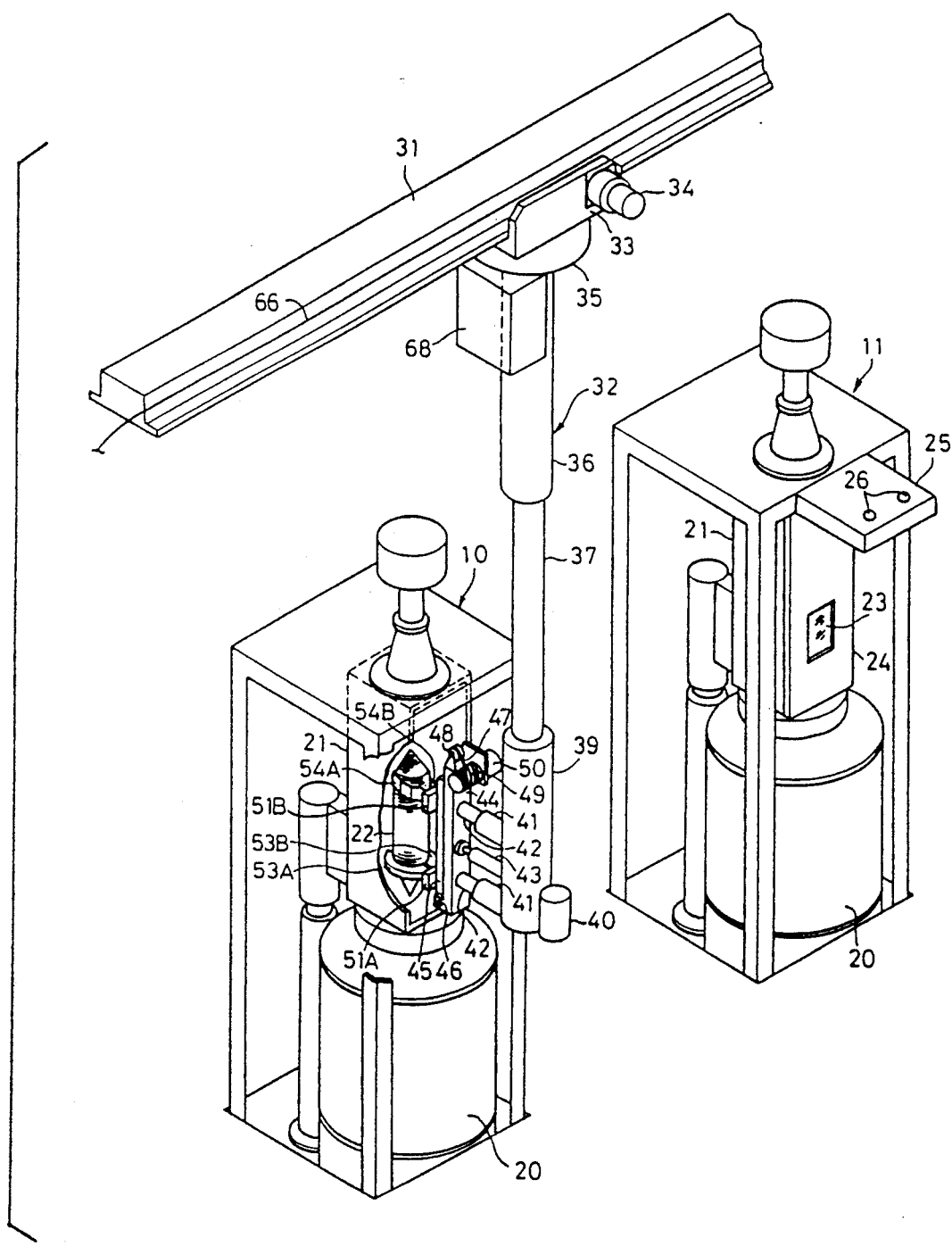
Figure 4:
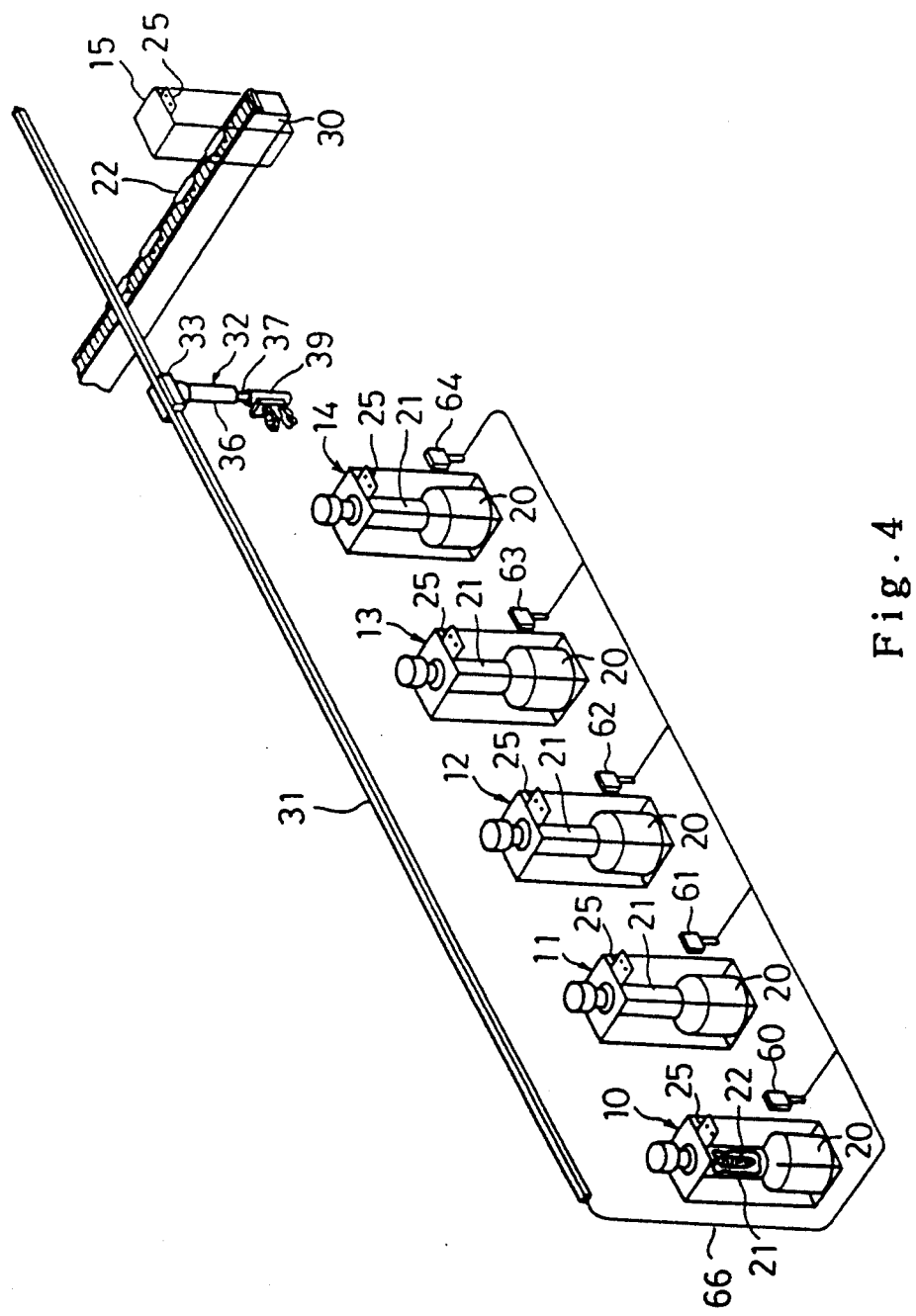

As shown in FIG. 4, there are a row of monocrystal pulling up devices 10 to 14 disposed at predetermined intervals in a factory. Each of the monocrystal pulling up devices 10 to 14 is arranged in such a manner that a pull-chamber 21 is concentrically formed with an opening formed in the upper portion of a main chamber 20 which includes a quartz crucible or the like. A grown monocrystal rod 22 is accommodated in the pull chamber 21 while being suspended from a pulling wire. As shown in FIG. 1, the pull chamber 21 has a shutting door 24 having a window 23 formed therein.

As shown in FIG. 4, a conveyer 30 is arranged in a direction perpendicular to the direction of the row of the monocrystal pulling up devices 10 to 14, the conveyer 30 being disposed by the side of the monocrystal pulling up device 14.

A rail 31 is disposed adjacent to the ceiling of the factory, the rail 31 extending along the row of the monocrystal pulling up devices 10 to 14 from a portion diagonally above the monocrystal pulling up device 10 to a portion above the conveyer 30. A travelling portion 33 of a monocrystal rod conveying device 32 is fastened to the rail 31 in such a manner that the travelling portion 33 is able to move along the rail 31.

Figure 2:
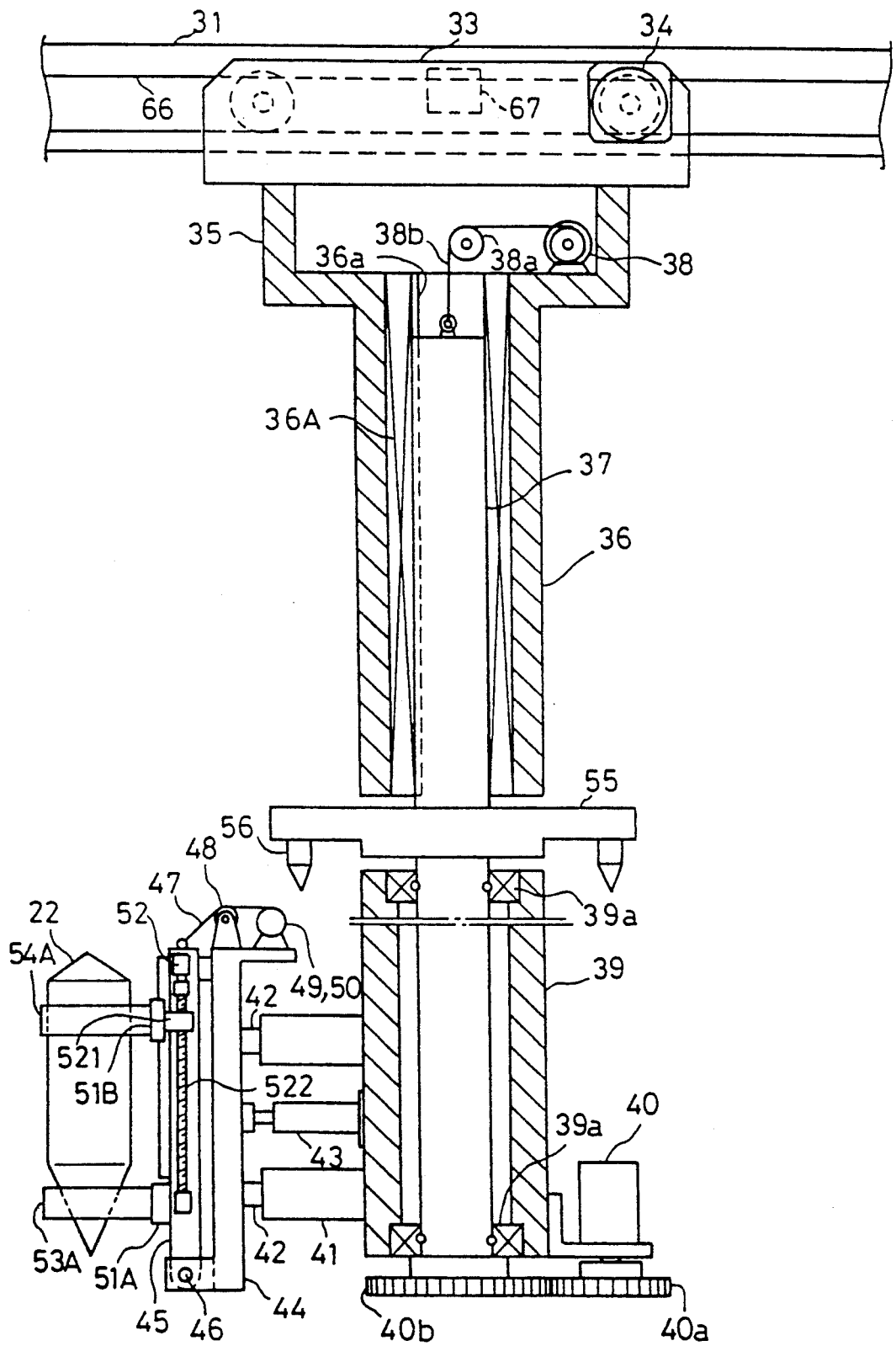

As shown in FIGS. 1 and 2, the upper end surface of an upper cylinder 36 is, via a neck portion 35, secured to the bottom surface of the travelling portion 33. A bearing 36A is fixed to the inner surface of the upper cylinder 36 which is vertically placed. The bearing 36A has a key 36a projecting inwardly and formed in the axial direction of the bearing 36A. On the other hand, a key seat extending in the axial direction of an elevational shaft 37 is formed in the surface of the elevational shaft 37, the key seat being formed to correspond to the above-described key 36a. In order to restrict the rotation of the elevational shaft 37 and to enable it to desirably move upward/downward, the elevational shaft 37 is inserted into the bearing 36A in a state where the key 36a is fitted within the above-described key seat. A geared motor 38 having the output shaft, to which a take-up drum is fastened, is secured to the inside portion of the neck portion 35. Furthermore, a pulley 38a is journalled in the neck portion 35 and a wire 36b is arranged in such a manner that it is wound around the take-up drum and the terminative end of the wire 38b is secured to the central portion of the upper end surface of the elevational shaft 37 via the pulley 38a. As a result, when the geared motor 38 is rotated forward/reversely, the elevational shaft 37 is not rotated, but is moved upward/downward.

A lower cylinder 39 having bearings 39a at the two end portions thereof is fastened around the lower portion of the elevational shaft 37 in such a manner that the lower cylinder 39 can be rotated with respect to the position of the elevational shaft 37 and its vertical movement is prohibited. A geared motor 40 is fastened to the lower cylinder 39 in such a manner that a gear 40a secured to the output shaft of the geared motor 40 is engaged with a gear 40b secured to the bottom end of the elevational shaft 37. As a result, when the geared motor 40 is rotated forward/reversely, the lower cylinder 39 is rotated clockwise/counterclockwise with respect to the position of the elevational shaft 37.

An end portion of an arm cylinder 41 is secured to the outer surface of the lower cylinder 39 in a direction perpendicular to the lower cylinder 39. An arm shaft 42 perpendicularly secured to a back base plate 44 at an end portion thereof is inserted into the arm cylinder 41. In order to adjust the distance between the lower cylinder 39 and the back base plate 44, a motor cylinder 43 is disposed between the above-described two elements. As a result, when the motor cylinder 43 is expanded/contracted, the arm shaft 42 is moved in the axial direction of the arm cylinder 41.

A tilt base plate 45 is disposed in front of the back base plate 44, the tilt base plate 45 being placed in parallel with the back base plate 44. The tilt base plate 45 is journalled by a support shaft 46 which is horizontally placed in the lower portion of the back base plate 44. An end portion of a wire 47 is connected to the top end portion of the tilt base plate 45, the wire 47 being wound around a drum 49 after it has been wound to the pulley 48. The drum 49 is rotated by a geared motor 50. The above-described pulley 48, the drum 49 and the geared motor 50 are fastened to the upper portion of the back base plate 44. Therefore, when the geared motor 50 is rotated forward/reversely, the tilt base plate 45 is rotated around the support shaft 46 in a direction in which the same is tilted/stood up.

Figure 3:
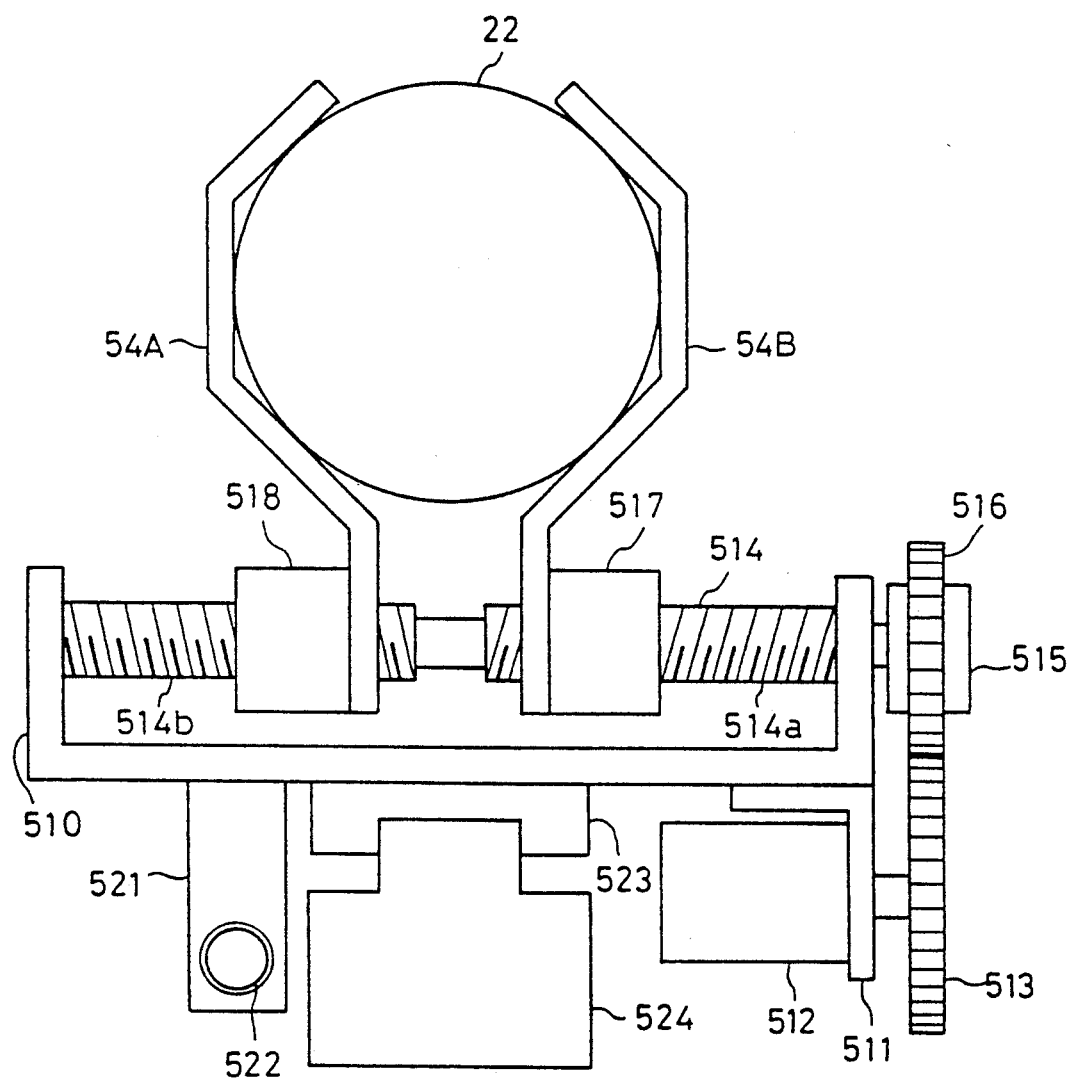

A finger drive portion 51A is secured to the lower portion of the front surface of the tilt base plate 45. Furthermore, a finger drive portion 51B is fastened to the tilt base plate 45 above the finger drive portion 51A in such a manner that the finger drive portion 51B is able to desirably be moved in the lengthwise direction of the tilt base plate 45. As shown in FIG. 3, the finger drive portion 51B is arranged in such a manner that a feed screw 522 is, by means of a thread formed on the surface thereof, inserted into a nut 521 secured to the back side of a frame 510. As shown in FIG. 2, the feed screw 522 is journalled by the tilt base plate 45 in such a manner that the feed screw 522 is rotated by a geared motor 52. As shown in FIG. 3, a channel 523 is secured to the central portion on the back side of the frame 510 in parallel with the feed screw 522, the channel 523 being engaged with a guide rail 524 secured to the tilt base plate 45. Therefore, the vertical position of the finger drive portion 51B can be adjusted in accordance with the length of the monocrystal rod 22 by the geared motor 52 fastened to the tilt base plate 45.

A geared motor 512 is secured to the side portion of the back side of the frame 510, the geared motor 512 having an output shaft to which a spur gear 513 is secured. On the other hand, a feed screw 514 having a right-hand screw 514a on either portion thereof and a left-hand screw 514b on another portion thereof is horizontally journalled in front of the frame 510. Furthermore, a spur gear 516, which is engaged with the spur gear 513, is secured to an end of the feed screw 514 via a torque limiter 515. A nut 517 is received by the right-hand screw 514, while a nut 518 is received by the left-hand screw 514b. A guide rod (omitted from illustration) is inserted into the above-described nuts 517 and 518 in order to prevent their rotations, the guide rod being inserted in parallel with the feed screw 514. The base portions of holding fingers 54B and 54A are secured to the corresponding nuts 517 and 518. Therefore, when the geared motor 512 is rotated forward/reversely, the holding fingers 54A and 54B approach each other or move away from each other. Furthermore, when the geared motor 512 is rotated forward and the monocrystal rod 22 is thereby held by the holding fingers 54A and 54B, the torque limiter 515 is caused to act so that the monocrystal rod 22 is held with predetermined force. Since the thus arranged approaching/moving away mechanism and the holding mechanism are similarly provided for the finger drive portion 51A, the descriptions about them are omitted here.

As shown in FIG. 2, a flange 55 is secured to the elevational shaft 37 at the uppermost position of the lower cylinder 39. Although omitted from FIG. 1, two pins 56, each of which has a pointed front end, are formed on the lower surface of the two end portions of the flange 55 in such a manner that the two pins 56 project downward. On the other hand, as shown in FIG. 4, a projecting tag 25 is formed in such a manner that it projects from the support frame of each of the monocrystal pulling up devices 10 to 14, the tag 25 having holes 26 (see FIG. 1) which correspond to the above-described pins 56 (the monocrystal pulling up device 10 shown in FIG. 1 is omitted from illustration). Similarly, a frame 15 having the same shape as the above-described support frame of each of the monocrystal pulling up devices 10 to 14 is disposed adjacently to the conveyer 30 on the extension of the row of the monocrystal pulling up devices 10 to 14. The projecting tag 25 is formed in such a manner that the tag 25 projects from the frame 15, the tag 25 having holes formed to correspond to the pins 56.

As shown in FIG. 4, command transmitting devices 60 to 64 are disposed in the side portions of the corresponding monocrystal pulling up devices 10 to 14, the command transmitting devices 60 to 64 being connected to a signal cable 66 which is arranged along the rail 31. On the other hand, a magnetic detector 67 is secured to the inner surface of the travelling portion 33 at a position adjacent to the signal line 66. The magnetic detector 67 is connected to a control unit 68 (see FIG. 1) fastened to the travelling portion 33. The above-described geared motors 34, 38, 40, 50, 511 and 52 and the motor of the motor cylinder 43 are connected to the control unit 68. The control unit 68 receives signals transmitted from the command transmitting devices 60 to 64 via the signal cable 66 and the magnetic detector 67 so as to control the geared motors 34, 38, 40, 50 and 52 and motor cylinder 43 in response to the signals thus received.

In accordance with each of the above-described operations, limit switches (omitted from illustration) for detecting the positions, at which the operations are respectively stopped, are disposed in such a manner that they are electrically connected to the control unit 68.

Figure 5:
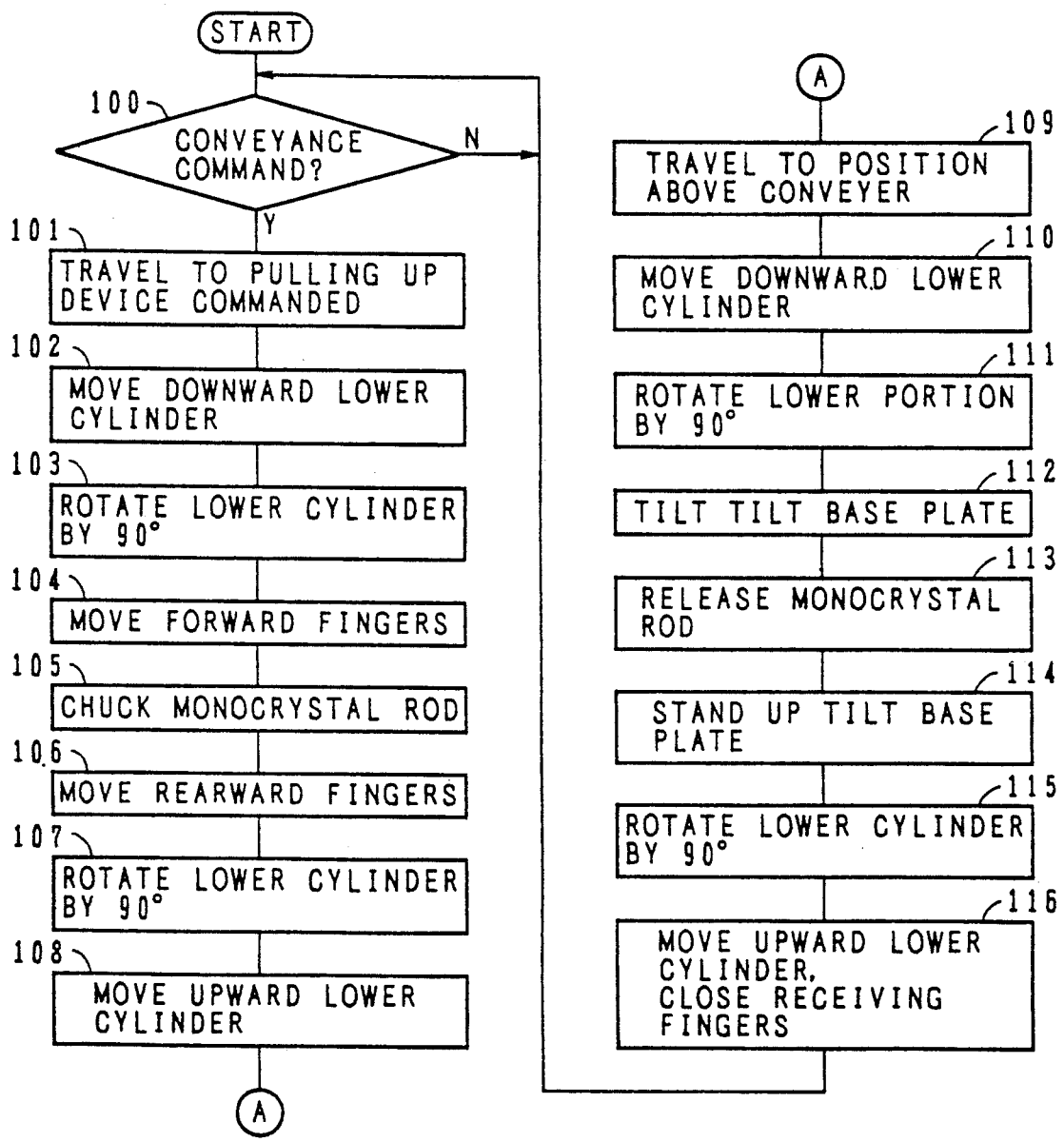

Then, the control sequence of the control unit 68 will now be described with reference to FIG. 5. First, the monocrystal rod conveying apparatus 32 is positioned above the conveyer 30 to wait the operation start.

(100). The control unit 68 waits for an issue of each of the carry-out commands from the command transmitting devices 60 to 64.

After an operator has confirmed that the monocrystal rod 22 had been grown, the same had been accommodated in the pull chamber 21 and a gate disposed between the main chamber 20 and the pull chamber 21 had been closed, the operator opens the shutting door 24 before the operator issues a conveying command to the control unit 68 by operating a switch of the command transmitting device 6i (hereinafter i=0 to 4). When the control unit 68 receives the conveying command thus-issued.

Figure 6C:
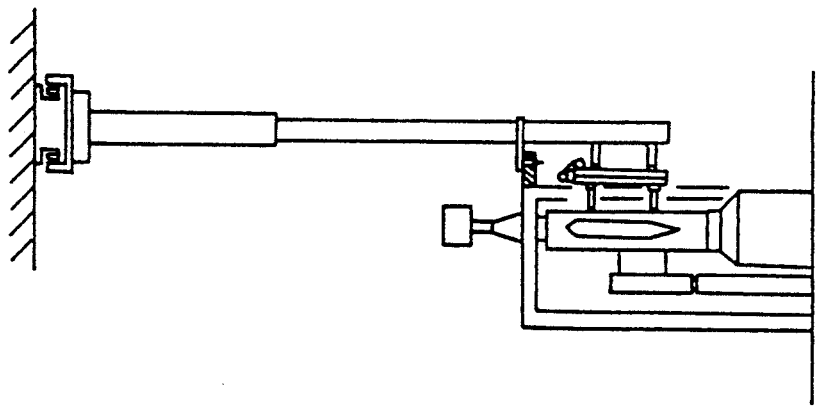
Figure 6B:
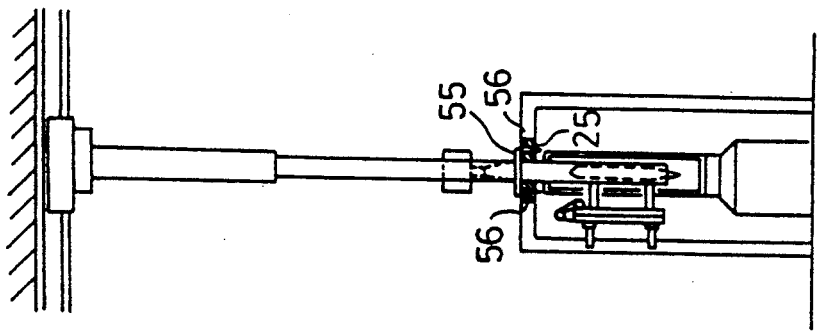
Figure 6A:
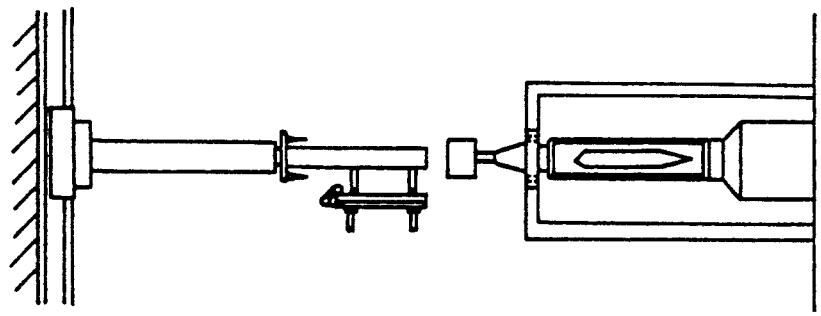

(101) It turns on the geared motor 34 so as to cause the monocrystal rod conveying device 32 to travel to the position which corresponds to the monocrystal pulling up device 1i which is the subject of the issued conveying command. As a result, a state shown in FIG. 6A is realized.

(102) The geared motor 38 is turned on so that the lower cylinder 39 is moved downward to its lowermost position. As a result, a state shown in FIG. 6B is realized. At this time, the pins 56 are fitted within the holes 26 formed in the tag 25 so that the lower cylinder 39 is stabilized.

(103) The geared motor 40 is turned on so as to rotate the lower cylinder 39 toward the monocrystal pulling up device 1i by an angular degree of 90°. As a result, as shown in FIG. 6C, receiving fingers 53A and 53B and the holding fingers 54A and 54B are made to confront the monocrystal rod 22.

Figure 6F:
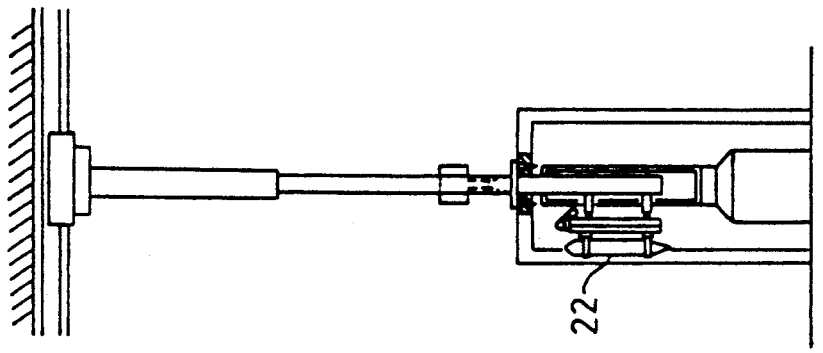
Figure 6E:
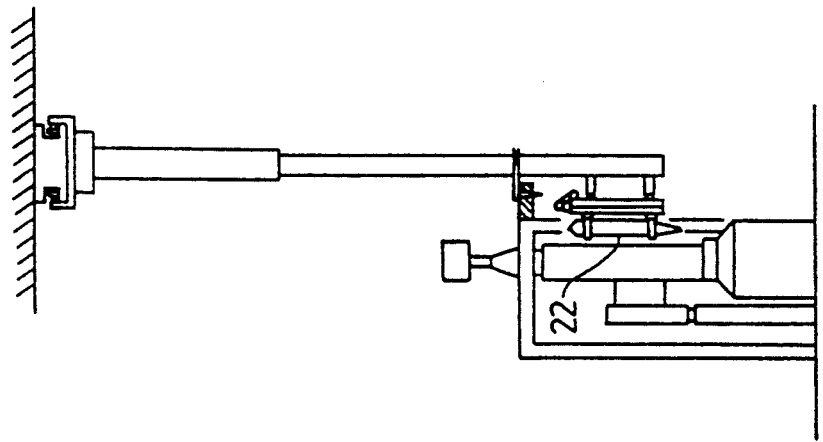
Figure 6D:
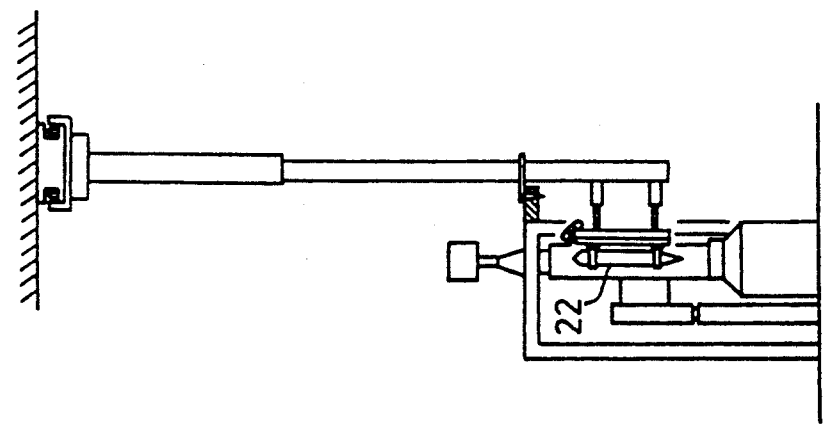

(104) The motor cylinder 43 is turned on so as to project the arm shaft 42 away from the arm cylinder 41 so that a state shown in FIG. 6D is realized. As a result, the receiving fingers 53A and 53B and the holding fingers 54A and 54B are introduced into the pull chamber 21 so that the direction of the center line, in which the monocrystal rod 22 is held, is made coincide with the direction in which the wire, which is suspending the monocrystal rod 22, is hung. In this state, the operator operates the switch so as to downward move the monocrystal rod 22. As a result, the lower portion of the monocrystal rod 22 is introduced into and held between the receiving fingers 53A and 53B so that the monocrystal rod 22 is received.

(105) The holding fingers 54A and 54B are made to approach each other so as to hold the monocrystal rod 22. In this state, the operation is temporarily stopped. The operator separates the reduced portion at the upper end portion of the monocrystal rod 22 by cutting before the operator operates the switch of the command transmitting device 6i so as to operate the monocrystal rod conveying apparatus 32.

(106) The control unit 68 turns on the motor cylinder 43 so as to return the arm shaft 42 so that a state shown in FIG. 6E is realized.

(107) The geared motor 40 is turned on so as to rotate the lower cylinder 39 around the elevational shaft 37 in the original direction by an angle of 90° so that a state shown in FIG. 6F is realized.

Figure 6H:
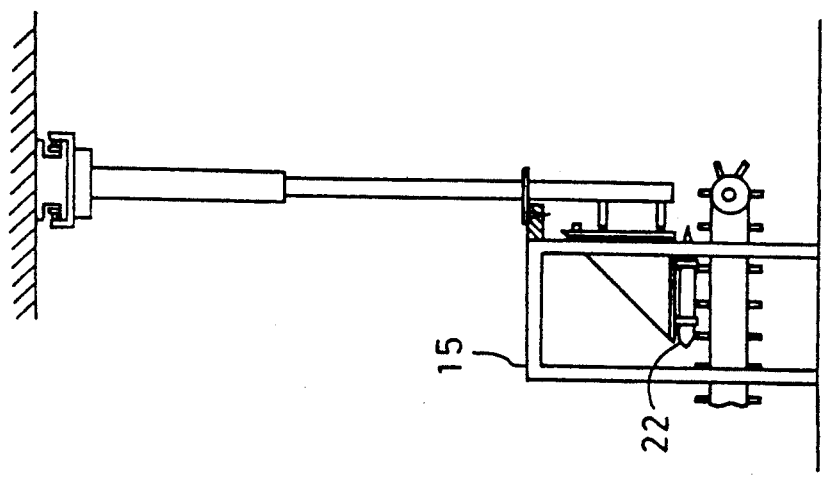
Figure 6G:
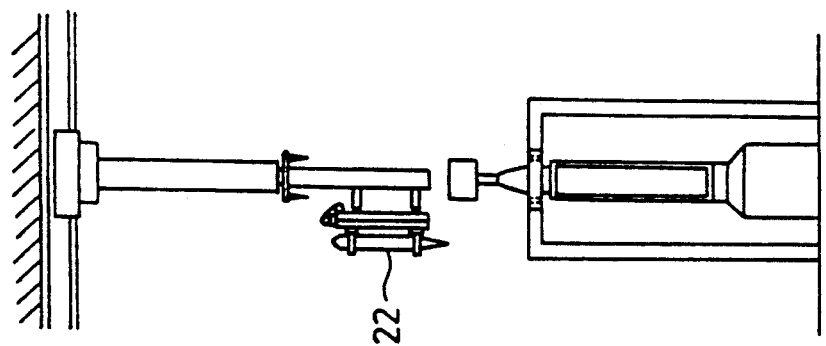

(108) The geared motor 38 is turned on so as to move the lower cylinder 39 to its uppermost position so that a state shown in FIG. 6G is realized.

(109) The geared motor 34 is turned on so as to make the monocrystal rod conveying apparatus 32 travel to a position above the conveyer 30.

(110) The geared motor 38 is turned on so as to move the lower cylinder 39 to its lowermost position. At this time, the pins 56 are fitted within the holes formed in the tag 25 so that the lower cylinder 39 is stabilized.

(111) The geared motor 40 is turned on so as to rotate the lower cylinder 39 around the elevational shaft 37 toward the forward position of the conveyer 30 by an angle of 90°.

(112) The geared motor 50 is turned on so as to rotate the tilt base plate 45 by an angle of 90° around the support shaft 46 in the tilting direction so that a state shown in FIG. 6H is realized. At this time, the movement of the conveyer 30 is stopped.

(113) The distance between the receiving fingers 53A and 53B and that between the holding fingers 54A and 54B are elongated so as to release the monocrystal rod 22. As a result, the monocrystal rod 22 is placed on the conveyer 30.

(114) The geared motor 50 is turned on so as to rotate the tilt base plate 45 around the support shaft 46 by an angle of 90° in the standing direction.

(115) The geared motor 40 is turned on so as to rotate the lower cylinder 39 by an angle of 90° around the elevational shaft 37 toward the original position.

(116) The geared motor 38 is turned on so as to upward move the lower cylinder 39 to its uppermost position. Simultaneously, the distance between the receiving fingers 53A and 53B are shortened before the flow returns to step 100 in which the re-starting of the operation is waited.

The present invention may include a variety of modifications.

For example, although the above-described embodiment is made about the structure in which the monocrystal pulling up device is the pulling up device arranged to act in accordance with the CZ method, the present invention may be applied to a monocrystal pulling device arranged to act in accordance with the FZ method.

Furthermore, the best mode of the structure is to dispose the rail 31 serving as the guide means adjacent to the ceiling. However, it may be disposed on the floor.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A monocrystal rod conveying apparatus (32) for taking out monocrystal rods (22) grown in a plurality of monocrystal pulling up devices (10 to 14) disposed in series, said monocrystal rod conveying apparatus comprising:

guide means (31) disposed along a plurality of said monocrystal pulling up devices;

a traveling portion (33, 34) for travelling along said guide means;

a body portion (35 to 40), having an end portion of which is fixed to said travelling portion;

a hand portion (51A to 54B) for holding/releasing said monocrystal rod;

a movable base portion (44 to 50) for supporting said hand portion; and an expansion portion (41 to 43) arranged in such a manner that its end portion is fastened to said body portion and another end portion is fastened to said movable base portion, said expansion portion being capable of changing distance between said body portion and said movable base, said body portion includes:

a base portion (35 to 38) fixed to said travelling portion; and a rotational portion (39, 40) capable of rotating around a vertical shaft with respect to the position of said base portion, said end portion of said expansion portion being fastened to said rotational portion, said base portion is arranged in such a manner that its lower portion is a shaft (47) and said rotational portion has a lower cylinder (39) into which said shaft is inserted, said lower cylinder being capable of rotating around said shaft.

2. A monocrystal rod conveying apparatus according to claim 1, wherein said movable base includes:

a back base (44) fixed to said other end portion of said expansion portion (41 to 43); and a tilt base (45) to which said hand portion is fastened, said tilt base being fastened on said back base rotatably around a horizontal axis (46), said hand portion (51A to 54B) being attached for said tilt base.

3. A monocrystal rod conveying apparatus according to claim 2, wherein said guide means (31) is a rail disposed to a ceiling side of a factory.

4. A monocrystal rod conveying apparatus according to claim 2, wherein said body portion is arranged in such a manner that said rotational portion (39 and 40) is able to move vertically with respect to said base portion (35 to 38).

5. A monocrystal rod conveying apparatus according to claim 4, wherein said base portion (35 to 38) is arranged in such a manner that an upper portion of said shaft (37) is inserted into an upper cylinder (36), said shaft being capable of moving in an axial direction in said upper cylinder.

6. A monocrystal rod conveying apparatus according to claim 2, wherein said hand portion (51A to 54B) includes:

receiving fingers (53A and 53B) into which a cone portion formed in a lower portion of said monocrystal rod (22), which has been placed perpendicularly, is inserted, said receiving fingers (53A and 53B) receiving said cone portion; and holding fingers for holding a straight body portion of said monocrystal rod.

* * * * *